United States Patent [19]
Taylor

[11] Patent Number: 5,341,100
[45] Date of Patent: Aug. 23, 1994

[54] ELECTROMAGNETIC WAVE METHOD AND APPARATUS FOR DOWNHOLE MEASUREMENT OF FLUID CONDUCTIVITY AND HYDROCARBON VOLUME DURING FORMATION TESTING

[75] Inventor: Robert M. Taylor, Stillwater, Okla.
[73] Assignee: Western Atlas International, Inc., Houston, Tex.
[21] Appl. No.: 994,984
[22] Filed: Dec. 22, 1992
[51] Int. Cl.$^5$ .................... G01V 3/30; G01N 22/00; E21B 49/00
[52] U.S. Cl. .................... 324/341; 73/61.43; 73/152; 73/155; 324/324; 324/338; 324/639
[58] Field of Search ............ 324/324, 325, 338, 341, 324/637–641; 73/152, 153, 155, 61.43, 61.44; 166/250, 251; 175/40, 46, 48, 58–60

[56]    References Cited
U.S. PATENT DOCUMENTS 3,944,910  3/1976  Rau ........................ 324/338
4,107,598  8/1978  Meador et al. .............. 324/341
4,458,524  7/1984  Meador et al. .............. 73/61.43
4,962,665 10/1990  Savage et al. ............ 324/324 X
5,103,181  4/1992  Gaisford et al. ............ 324/637

Primary Examiner—Gerard R. Strecker
Attorney, Agent, or Firm—James L. Jackson

[57] ABSTRACT

There is disclosed in the present specification a method and apparatus for use of a downhole formation multi-tester instrument in the characterization of formation fluids, including measurement of the conductivity of water, often in the presence of hydrocarbons under dynamic flow conditions and determining the hydrocarbon volume of the formation fluid. Utilizing a coaxial transmission line as a flow tube within the formation multi-tester instrument an electromagnetic wave is generated which propagates through the formation fluid in a transverse electromagnetic mode. Measurement of the phase shift and attenuation of the electromagnetic wave at points within the flow tube allow characterization of the fluid inside the cavity of the flow tube for dielectric constant and conductivity. Dielectric constant and conductivity can then be related to fluid conductivity and hydrocarbon volume.

13 Claims, 4 Drawing Sheets

ELECTROMAGNETIC WAVE METHOD AND APPARATUS FOR DOWNHOLE MEASUREMENT OF FLUID CONDUCTIVITY AND HYDROCARBON VOLUME DURING FORMATION TESTING

FIELD OF THE INVENTION

This invention relates generally to the measurement of formation fluid for determination of fluid conductivity and fluid hydrocarbon volume to thereby enable various formation characteristics, including in situ formation fluid volume and hydrocarbon volume to be determined. More particularly, the present invention concerns a method and apparatus for measuring fluid conductivity and hydrocarbon volume of a formation fluid in the downhole environment by means of a formation multi-tester instrument capable of acquiring formation fluid from subsurface earth formations of interest and to characterize fluid samples as they are recovered from subsurface geological formations.

BACKGROUND OF THE INVENTION

Wireline formation testing is a process where a formation testing device is lowered into an open wellbore and positioned adjacent to the geological formation of interest. The device then seats a packer against the formation wall and forces a fluid extraction tube through the packer into the formation. Formation pressure is measured and a sample of formation fluids can then be extracted. Tool power and communication with surface telemetry is accomplished with a seven conductor wireline. Formation fluid samples are usually taken from points in the well in which previously recorded electrical logs indicate the possibility of hydrocarbons. Several liters of fluid ar, e typically taken. Currently, the composition of these fluid samples cannot be determined until the device is returned to surface.

A well that has been drilled for the purpose of producing hydrocarbons typically consists of a hole that is cylindrical in nature with diameters from a few inches to tens of inches and depths below the earth's surface ranging from a few hundred to tens of thousands of feet. After drilling has been completed electronic measurement devices are lowered into the well to record rock and fluid properties as a function of well depth for use in predicting the presence of hydrocarbons. Among these instruments is a formation testing device which is capable of extracting fluid samples from subsurface formations penetrated by the wellbore. Currently, the composition of these fluid samples cannot be determined until the formation testing device is returned to surface. A measurement technique has been developed to characterize a fluid sample in situ for fluid conductivity and, in some cases, hydrocarbon volume.

Numerous methods for measuring complex permittivity of fluids have been documented. These methods can typically be classified as transmission, resonance, or reflection in nature. Resonance type methods typically consist of measuring the quality factor of the cavity (Q and the resonant frequency of the cavity when filled with the fluid. This type of measurement is not well suited to extremely high conductivity measurements due to the Q of the cavity becoming very small. Reflection methods depend on a changing reflection coefficient or voltage sanding wave ratio as a lossy material is introduced as a line load or discontinuity. Again, this method yields poor accuracy for very high conductivities. Transmission type measurements where the lossy medium is substituted for some portion of the transmission line dielectric give the best results for high conductivity materials.

The TEM transmission line technique and the cavity technique for characterization of properties of materials such as formation fluid have been in use for a considerable period of time and have been extensively utilized for determination of hydrocarbon volume of formation fluid including other fluid constituents such as water and natural gas. One significant limitation for the determination of dielectric constant from resonant frequency lies in the fact that the Q of the testing cavity will be very low when completely filled with highly conductive fluids, hence determination of the conductivity will be very difficult. The usual technique (for lossy materials) is to place a very small sample in the testing cavity and to use perturbation techniques to determine the material properties.

The characterization of formation fluid for hydrocarbon volume as it enters a formation multi-tester instrument located downhole in fluid communication with a subsurface production formation of interest is considered a feature that would greatly enhance the effectiveness of the multi-tester instrument. The characterization of formation fluids should include measurement of the conductivity of water, often in the presence of hydrocarbons, under dynamic flow conditions.

SUMMARY OF THE INVENTION

It is a principle feature of the present invention to provide a novel method and apparatus for downhole characterization of formation fluids as to dielectric constant and conductivity and relating the same to fluid conductivity and hydrocarbon volume.

It is another feature of this invention to provide a novel method and apparatus for characterization of formation fluids utilizing a coaxial transmission line in a formation multi-tester instrument as a flow tube and propagating an electromagnetic wave through the formation fluid in the coaxial transmission line in a transverse electromagnetic (TEM) mode and then measuring the phase shift and attenuation of the electromagnetic wave at spaced points in the flow tube to provide for characterization of the fluid inside the cavity of the flow tube for dielectric constant and conductivity from which fluid conductivity and hydrocarbon volume can be determined.

It is an even further feature of this invention to provide a measurement system for characterization of production fluid in the downhole environment wherein formation fluid is caused to flow between the inner and outer conductors of a coaxial transmission line while the phase shift and attenuation between two points on the transmission line is monitored, thus providing in situ conductivity measurements under dynamic fluid flow conditions.

Briefly, the various features of the present invention are realized through the provision in a downhole formation multi-tester instrument of a measurement system that is capable of characterizing fluid conductivity and hydrocarbon volume over the range typically encountered in formation production operations in oil wells. A section of fluid recovery flowline of the multi-tester instrument is constituted by a coaxial transmission line so that formation fluid flowing between the center conductor and the outer tube of the transmission line will alter propagation characteristics of an electromagnetic wave traveling on the transmission line. Wave propagation characteristics are utilized to characterize the fluid flowing in the tube for conductivity and hydrocarbon volume. Because of its presence within a formation testing instrument, the physical size of the fluid characterizing or measurement system will be quite small. The electromagnetic wave generated in the coaxial transmission line of the flow tube will propagate through the fluid in a transverse electromagnetic mode. Measurement of the phase shift and attenuation of the electromagnetic wave at spaced locations within the flow tube will allow characterization of the formation fluid inside the cavity that is defined by the coaxial transmission line or flow tube for dielectric constant and conductivity. The dielectric constant and conductivity of the formation fluid, as electronically sensed, can then be related to fluid conductivity and hydrocarbon volume.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

In the Drawings

FIG. 1 is a simple block diagram type electronic schematic of the preferred embodiment of this invention and shown to be disposed in fluid characterizing relation with a wave guide/flow tube of a downhole formation multi-tester instrument through which formation fluid is conducted.

FIG. 2 is a fragmentary sectional view of a portion of a downhole formation multi-tester instrument including an elongate measurement chamber, being a section of a flow tube or passage through which formation fluid flows as it is pumped or otherwise conducted from the formation into the instrument.

FIG. 3 is a more detailed, block diagram schematic illustration of the electronic circuitry of the present invention shown in operative fluid characterizing relation with a flow tube of the multi-tester instrument.

FIG. 4 is an electronic block diagram schematic illustration of the present invention having its signal input and output connections disposed in coupled relation with the formation multi-tester measurement chamber construction of FIG. 2.

DETAILED DESCRIPTION OF PREFERRED EMBODIMENT

Figure 1:
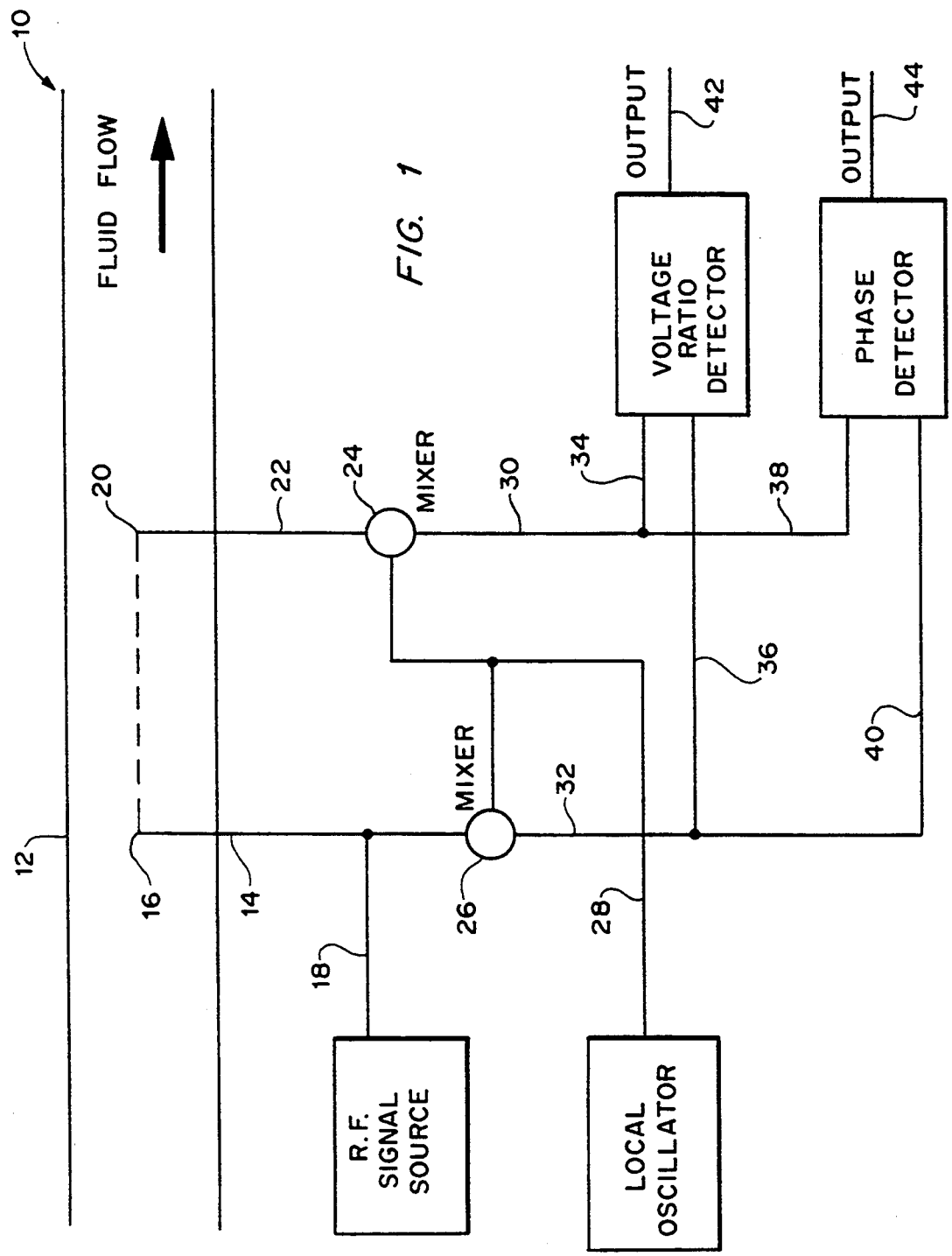

The measurement system of this invention is to be utilized as an integral part of a formation testing system that measures the fluid conductivity as the sample enters the testing system. Typical formation testing systems consist of a cylindrical housing less than four inches in outside diameter and tens of feet in length. This housing contains electronics, pumps, hydraulics, and fluid sample holding chambers. Therefore physical size should be held to the minimum necessary to obtain a viable measurement. The size limitation must be met by both the measurement flowtube and the electronics for the fluid characterization system. For example, the measurement tube length should not exceed three inches and the flowtube inside diameter should not exceed 0.3 inches. Flowtube inside diameters greater than 0.3 inches could possibly adversely affect sample flow characteristics. The electronics should also be kept as small as possible, although the first concern will be to provide a repeatable accurate measurement. An electronics package smaller than 3 inches by 3 inches, achieved using hybrid packaging techniques, should be ideal. The above noted dimensions are intended to be representative of the preferred embodiment of this invention and are not intended to limit the spirit or scope thereof.

It is intended that a fluid salinity range of from about 250 ppm to about 250,000 ppm of sodium chloride be measurable. The approximate relationships given below relate parts per million of sodium chloride in water to the solution resistivity in ohm meters and relate the water conductivity to changes in temperature according to the equation:

$$R_{w75} = .0123 + \frac{3647.5}{[PPM\ (NACL)]^{.995}}$$

$R_{w75}$ = Water resistivity at 75°
PPM(NACL) = Parts per million sodium chloride and according to the equation:

$$R_{w2} = R_{w1} \frac{T_1 + 6.77}{T_2 + 6.77}$$

$T_1$ = Temperature 1 in degrees Fahrenheit
$T_2$ = Temperature 2 in degrees Fahrenheit
$R_{w2}$ = Fluid resistivity at temperature 2
$R_{w1}$ = Fluid resistivity at temperature 1

Using these conversions with the given salinity range and temperatures from 72° F. (room temperature) to 350° F., the operating conductivity will range from 0.5 mhos to 115 mhos per meter. The system is also intended to be capable of measuring the conductivity of fluids ranging from zero to 100 percent Hydrocarbons. Increasing the hydrocarbon content of a fluid sample will decrease the measured conductivity and dielectric constant.

The purpose of the measurement system is to provide a means of continuously monitoring fluid conductivity and prediction of hydrocarbon content. This is accomplished by measuring the phase shift and attenuation between two points within a flow tube in which the fluid under investigation fills the space between inner and outer conductors.

With fluid filling the dielectric region of a coaxial line, an electromagnetic wave propagating on the line will attenuate and phase shift as a function of the dielectric constant and conductivity of the fluid. By comparing signals taken from two points on the line a known distance apart, attenuation and phase shift can be measured. This attenuation and phase shift is then used to calculate the fluid conductivity. At frequencies that are low enough to propagate in a transverse electromagnetic mode, and at higher conductivities the relationships relating attenuation, phase shift, conductivity, and dielectric constant are identical to those of a plane wave propagating in a homogeneous conducting medium. For low conductivity the boundary conditions at the connectors must be considered.

The geometry of a coaxial line measurement is also well suited to continuous measurement in a fluid flow environment. The coaxial line measurement system can be inserted into the fluid flow path without significantly disrupting fluid flow characteristics.

Referring now to the drawings and first to FIG. 1 there is disclosed a simple block diagram schematic illustration of a formation fluid characterization system constructed in accordance with the present invention and shown generally at 10. The system 10 incorporates a wave guide/flow tube 12 which may be formed within or defined by a downhole formation multi-tester instrument, by means of a coaxial transmission line that defines the flow tube 12. As is shown by the block diagram electronic schematic an input conductor 14 extends into the flow tube 12 and provides a radio frequency signal emission or input at 16 from an RF signal source via a conductor 18. Signal input at 16 develops an electromagnetic wave that propagates through the formation fluid contained within the flow tube to point 20 where it is then directed via conductor 22 to a mixer circuit 24. The RF signal of the signal source is also communicated to a mixer circuit 26. The mixer circuits are provided via conductor 28 with a local oscillator signal thereby developing signal voltages in output conductors 30 and 32 of the mixer circuits respectively. These voltages, which differ by the phase shift and attenuation that occurs by virtue of the volume of hydrocarbons in the content of the fluid being conducted through the flow tube, are provided at a voltage ratio detector via conductors 34 and 36 and a phase detector circuit via conductors 38 and 40. Thus, the voltage ratio detector circuit provides an output at conductor 42 which is representative of the attenuation that occurs by virtue of the characterization of the formation fluid. The phase detector circuit provides an output signal at 44 being representative of the phase ratio or shift that is induced by the character of the formation fluid under test. The output signals of conductors 42 and 44 may be further processed to provide a signal confirming the hydrocarbon content of the formation fluid.

Figure 2:
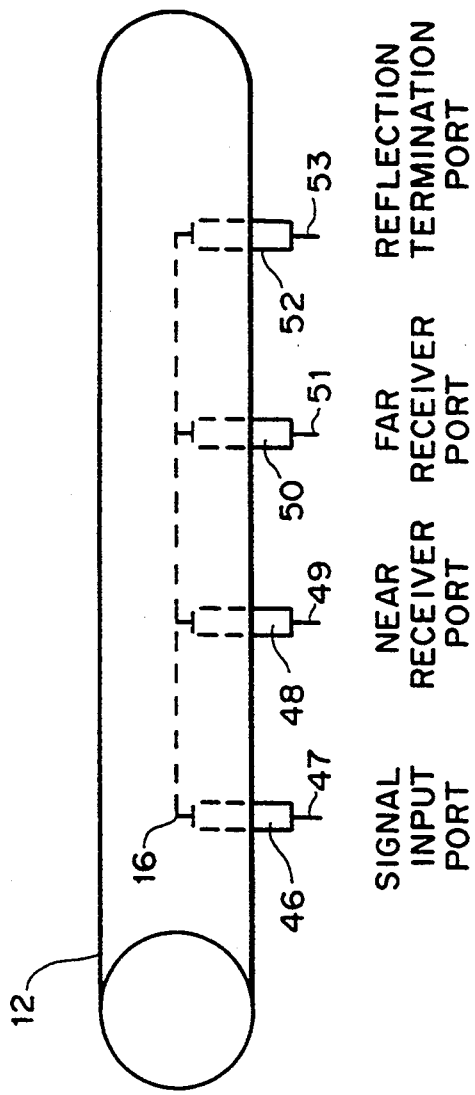

As shown in FIG. 2, the coaxial flow tube 12, which may be defined by a portion of the formation fluid inlet passageway system of the downhole multi-tester instrument, is of a specific dimension for defining an open ended measurement chamber at any given point in time. For example, the flow tube 12 may have an internal diameter in the order of 0.3 inches and the fluid measurement chamber defined by the flow tube may be in the order of 3 inches in length. These particular dimensions however are only intended to be representative of a flow tube design constructed in accordance with the teachings of this invention. It should be born in mind that the dimension and length of the flow tube measurement chamber may have any suitable dimension that is desired. The flow tube is provided with a signal input port of a suitable construction to receive an RF transmitter permitting generation of an electromagnetic wave within the flow tube 12 at point 16.

In order to identify attenuation and phase shift that is induced in the electromagnetic wave by virtue of the character of the formation fluid, the flow tube measurement chamber is provided with a near receiver port 48 which is appropriately spaced from the point of electromagnetic wave generation and which is adapted to receive a sensor for detection of the phase and amplitude of the electromagnetic wave. For example, in the measurement chamber shown, the near receiver port 48 is located at a distance of 1 inch from the point of electromagnetic wave generation defined by signal input port 46. The flow tube is also provided with a far receiver port 50 which is positioned further from the point of wave generation and which thus functions to detect attenuation and phase shift of the electromagnetic wave that occurs through the distance of the measurement chamber from the point 16 of electromagnetic wave generation to the far receiver port 50. The far receiver port is also adapted to receive a phase and amplitude detection sensor.

The receiver ports are coupled to network analyzer inputs of the signal processing electronics by matched, equal length coaxial cables 49 and 51. The output of the network analyzer is coupled to signal input port via cable 47 while the reflection termination port 52 is coupled to a load such as a 50 ohm matched resistance to prevent reflections from interfering with the receiver port signals.

The near and far receiver ports are thus electrically symmetrical, thus providing equal reflection coefficients for the two ports. This allows the attenuation and phase shift measured between the ports to be related directly to conductivity, without any need to correct for line mismatch between the ports.

The near and far receivers will have predetermined spacing in relation to the location of the signal input port so that the distance from the far receiver port to the signal input port is twice the distance from the signal input port to the near receiver port. As shown in FIG. 2, the distance between the near and far receivers is shown to be 1 inch; thus, the distance between point 16 and the far receiver port 50 is 2 inches. The far receiver port therefore detects wave attenuation and phase shift at a distance of 2 inches from the point of wave generation.

A reflection termination port 52 is shown to be located in spaced relation from the far receiver port 50 by a distance of 1 inch and being a total distance of 3 inches from the point of electromagnetic wave generation 16.

Figure 3:
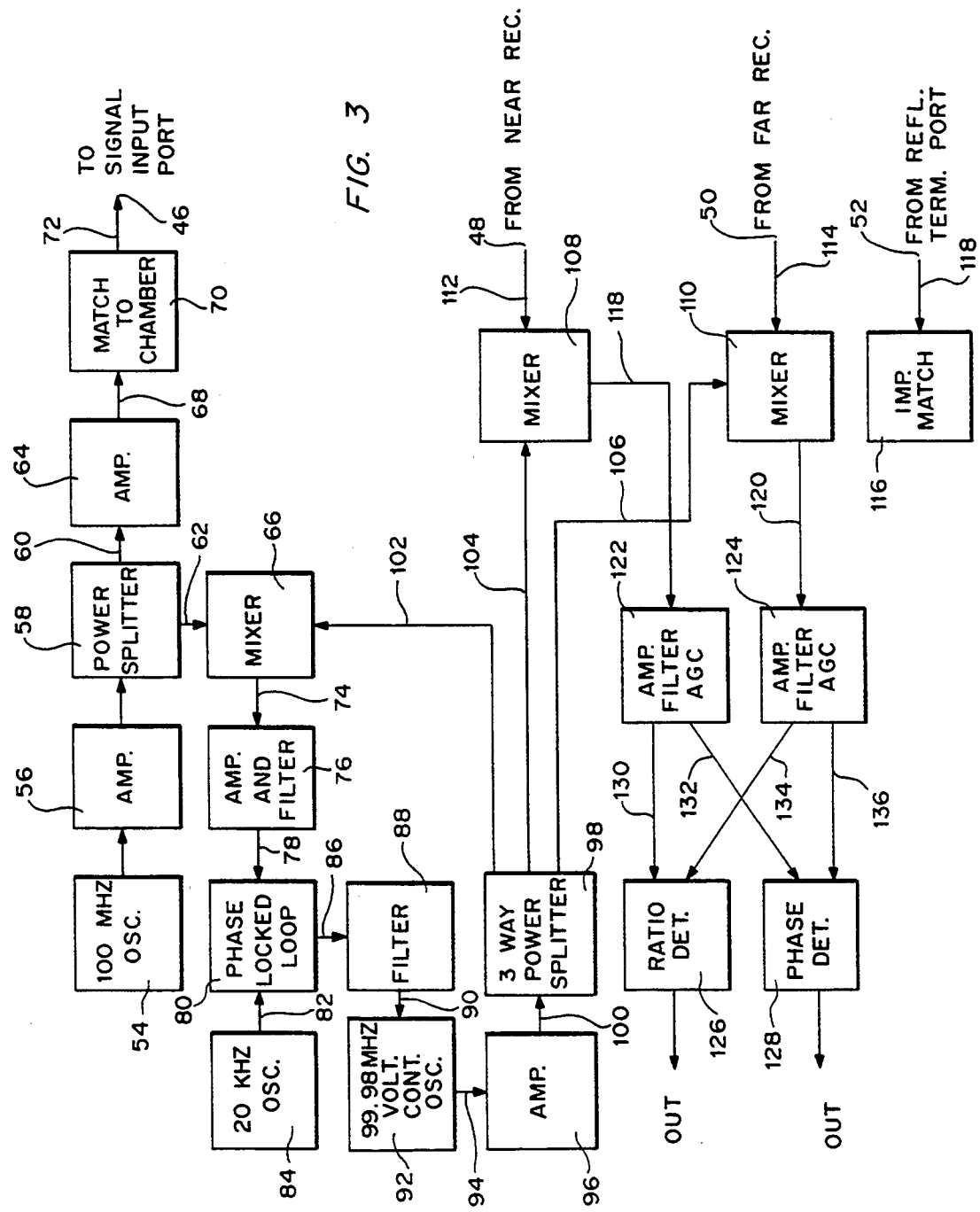

Referring now to FIG. 3, the block diagram electronic schematic should be considered in its relation with the measurement chamber shown in FIG. 2. As shown, a 100 mhz radio signal is generated by oscillator circuit 54 which is amplified by RF amplifier circuit 56. The amplified RF signal is then split by power splitter circuit 58 providing amplified RF signal outputs at 60 and 62 which are conducted to amplifier circuit 64 and mixer circuit 66. The amplified signal output 68 is then processed by impedance matching to chamber circuit 70, thus providing a RF signal output to the signal input port 46. This feature ensures optimum conditions for line termination which may otherwise be less than optimum because of the tendency for the characteristic impedance of the coaxial transmission line to vary as a function of the conductivity and dielectric constant of the formation fluid.

The mixer circuit 66 provides an output 74 to an amplifier and filter circuit 76 which in turn provides its output 78 to a phase locked loop circuit 80 which also receives the output 82 of an oscillator circuit 84 and output 86 of the phase locked loop circuit is also processed by a filter circuit 88 thus providing a filter output 90 to a local oscillator circuit 92. An output 94 of the oscillator circuit 92 is amplified by computer circuit 96 thus providing an amplified output to a three-way power splitter circuit 98 via output conductor 100. Output conductors 102, 104 and 106 of the three-way power splitter circuit 98 input the amplified output of the local oscillator circuit 92 to mixer circuits 66, 108 and 110. The mixer circuit 108 is connected via input conductor 112 to the near receiver port 48 of FIG. 2 while the mixer circuit 110 is coupled via input conductor 114 to the far receiver port 50. An impedance matching circuit 116 is provided to receive via input conductor 118 the input signal from the reflection termination port 52 as shown in FIG. 2.

The output signals of mixer circuits 108 and 110 are conducted respectively via conductors 118 and 120 to amplifier, filter and automatic gain control circuits 122 and 124. The outputs of circuits 122 and 124 are conducted both to ratio and phase detector circuits 126 and 128 via conductors 130, 132, 134 and 136.

Figure 4:
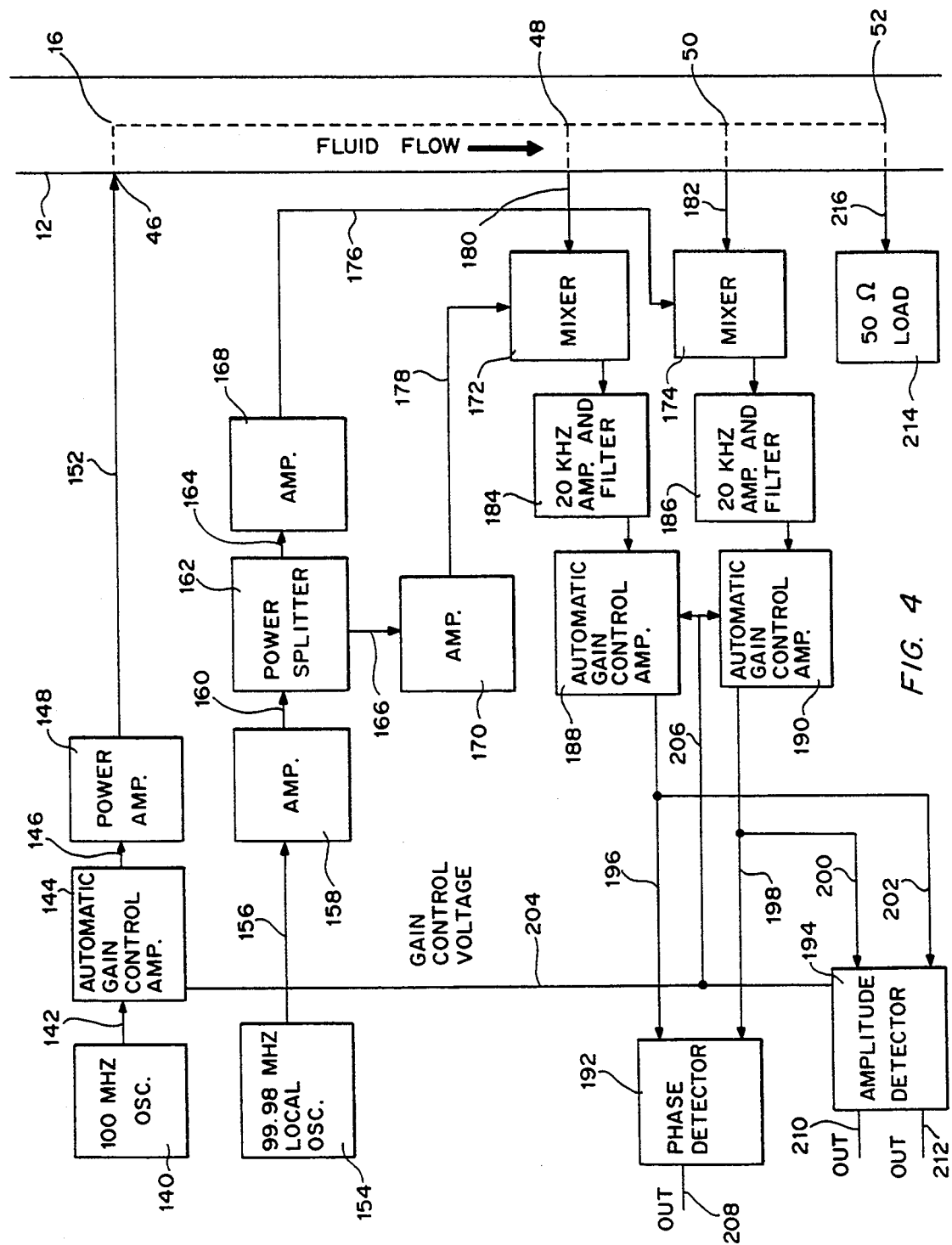

FIG. 4 is a block diagram electronic schematic illustration similar, but in less detail, as compared to that of FIG. 3, and illustrating the flow tube 12 of the downhole formation multi-tester instrument in coupled relation with the electronic circuitry illustrated by the block diagram schematic. The near receiver, far receiver, and reflection termination ports 48, 50 and 52 are also shown in relation to the flow tube 12 as is the generation point 16 of the electromagnetic wave that propagates through the fluid of the flow tube and is attenuated and phase shifted in relation to the character of the fluid, i.e., the percentage of hydrocarbon in relation to the percentage of water. An oscillator circuit is shown at 140 which provides a 100 mhz output 142 which is received by an automatic gain control amplifier circuit 144 providing its output 146 to a power amplifier circuit 148. The output 150 of the power amplifier circuit 148 is provided as the signal input of the signal input port 46 of the flow tube 12 shown in FIG. 2.

A local oscillator circuit 154 provides its 99.98 Mhz output 156 for amplification via amplifier circuit 158 and for delivery via output conductor 160 to a two-way power splitter circuit 162 having outputs 164 and 166 coupled with amplifier circuits 168 and 170 respectively. The amplified local oscillator signal is thus communicated to mixer circuits 172 and 174 via amplifier output conductors 176 and 178 respectively. The mixer circuits 172 and 174 receive the output signals of the near and far receiver ports via signal conductors 180 and 182. The outputs of the mixer circuits 172 and 174 are processed by 20 khz amplifier and filter circuits 184 and 186 respectively with the outputs thereof being communicated to automatic gain control amplifiers 188 and 190. Both of the circuits 188 and 190 provide output signals to a phase detector circuit 192 and an amplitude detector circuit 194 via conductors 196, 198, 200 and 202. Conductor 204 receives gain control voltage from the automatic gain control amplifier 144. All of the automatic gain control amplifiers 144, 188, and 190 are provided with gain control voltage via conductors 204 and 206. The phase detector circuit 192 provides an output signal at 208 which is received and processed to provide a visual display of the phase shift that is detected between the far and near receiver ports. The amplitude detector circuit 194 provides outputs 210 and 212 representing the electromagnetic wave attenuation that occurs between the near and far receiver ports 48 and 50. These amplitude detector outputs are also subjected to further processing for appropriate visual display.

The circuitry of FIG. 4 also includes a load circuit 214 which is coupled via conductor 216 to the reflection termination port 52. As shown, the circuit 214 provides a resistance load of 50 ohms. The circuit 214 is employed for impedance matching to thus provide a signal which may be detected to insure that a proper relationship is established relating dielectric constant and conductivity to hydrocarbon volume and fluid conductivity. This is because the characteristic impedance of a coaxial transmission line will vary as a function of the conductivity and dielectric constant of the medium filling the line. The effects of the impedance mismatch in termination is utilized to predict the best possible termination impedance and to include the reflection effects of the apparatus.

The optimum fluid characterization system will maximize the dependency of the attenuation and the phase shift to changes in fluid conductivity while at the same time keeping the electronic complexity to a minimum. It is thought that increasing the tube length and/or the operating frequency, will increase the measurement sensitivity, but at the expense of increasing the electronic complexity (due to increasing signal attenuation). Therefore, a compromise must be made to achieve suitable measurement capabilities. Measurement tube length and operating frequency will be limited so that reasonable signal levels are maintained over the full operating conductivity range.

From the standpoint of Geometry, design of the measurement tube Geometry includes the categories of tube length, inside and outside conductor diameters, and connector configuration. Experimental measurements indicate signal deviation from the theoretical plane wave response at the lowest conductivity considered. This deviation is due to reflections from line discontinuities that exist at the measurement point connections. At higher conductivity, the increased attenuation damps reflections. Choosing the tube length to be as long as possible will minimize the conductivity at which the deviation becomes significant. From this it has been determined that the tube length will be about three inches, the maximum permitted by the physical specifications of the final downhole multi-tester product.

Attenuation and phase shift are independent of both the flow tube diameter and the ratio of inside to outside diameter. Line characteristic impedance does vary with the diameter ratio, although for a predetermined diameter ratio characteristic impedance also varies as a function of fluid conductivity. Thus, choosing a diameter ratio for an impedance match would only be valid at a single conductivity. Tube diameter thus should be sufficiently large to enable the connection to be made to the center conductor. All connections to the center conductor are preferably made through the sides of the tube; the ends of the tube being reserved for the attachment of fluid flow lines. In the embodiment shown in FIG. 2, a 50 ohm coaxial line is connected to each of the four ports. One end is used to feed the signal to the center conductor while the 50 ohm line on the other end is terminated in a matched load. The two center ports are connected to receivers. The closest one to the feed port is referred to as the near receiver, the other is the far receiver. The advantage of this configuration is the impedance symmetry it provides for the receivers. The two receivers thus have matched impedance, thus providing the capability for fluid characterization measurements regardless of the direction on the line.

To avoid measurement ambiguities, the operating frequency must be kept low enough to avoid a phase shift between the receiver ports in excess of 360°. Previous analysis indicates a phase shift of 360° at the maximum expected conductivity across one inch of flow tube at approximately 150 Mhz. Thus this is the highest permissible operating frequency for the one inch receiver's spacings that are set forth in FIG. 2. Obviously, operating frequency may vary with the dimensions of the receiver spacings.

The choice of operating frequency as it pertains to attenuation becomes a question of electronic complexity. For higher attenuations, gain compensation must be employed to reduce the range of input signal level over which the phase shift and attenuation measurement circuitry must function. From the standpoint of initial testing, the range of 30 dB was chosen as the signal level variation after the mixer stages to correspond to the gain range of available gain compensation amplifiers. This represents voltage levels at the detectors from a few hundred millvolts to approximately 10 volts. The gain compensation amplifiers available have an adjustable range of 30 dB. One of these amplifiers will typically be included in the transmitter and one in the receiver stages. This will allow total system attenuation of 90 dB in the distance from the transmitter to the far receiver (two inches in the example of FIG. 2).

The electronic system set forth in FIGS. 3 and 4 supplies a transmitter signal to the tube and processes the receiver signal to obtain DC voltage signals proportional to signal phase and amplitude differences between the receiver ports. An electronic system that is suitable for the present invention includes a variable gain, 100 Mhz transmitter feeding the fluid flow tube test fixture. The receiver ports are terminated in two identical channels to maintain relative signal amplitude and phase shift. The first stage in each channel is a variable gain amplifier which feeds a frequency mixer. The mixer is driven by a 99.980 Mhz local oscillator, producing (when mixed with the 100 Mhz signal) a 20 Khz intermediate frequency (IF) signal. The intermediate frequency amplifier filters out the unwanted mixer side bands and amplifies the desired signals before passing them on to the phase and amplitude detection circuitry. The amplitude detector output then supplies a control voltage which is fed to the variable gain amplifiers amplifier to control total system gain. Controlling system gain allows the use of phase and amplitude detectors with dynamic ranges of only a fraction of the total system dynamic range. This makes the measurement accuracy over the full system range much easier to achieve.

In view of the foregoing, it is evident that the present invention is one well adapted to attain all of the objects and features hereinabove set forth, together with other objects and features which are inherent in the apparatus disclosed herein.

As will be readily apparent to those skilled in the art, the present invention may be produced in other specific forms without departing from its spirit or essential characteristics. The present embodiment, is therefore, to be considered as illustrative and not restrictive, the scope of the invention being indicated by the claims rather than the foregoing description, and all changes which come within the meaning and range of the equivalence of the claims are therefore intended to be embraced therein.

What is claimed is:

1. A method of measuring fluid conductivity and hydrocarbon volume of formation fluid in the downhole environment by means of a formation multi-tester instrument capable of acquiring formation fluid from a subsurface earth formation, comprising:
   (a) locating a formation multi-tester instrument having an internal flow passage within a well bore at the depth of a formation of interest;
   (b) establishing fluid communication between said formation and said multi-tester instrument by means of a sampling probe of said instrument in communication with said internal flow passage;
   (c) introducing said formation fluid into said internal flow passage of said instrument;
   (d) generating an electromagnetic wave by input of an electromagnetic signal at a predetermined point within said formation fluid in said internal flow passage said electromagnetic wave undergoing phase shaft and attenuation as it traverses through said formation fluid as a function of oil volume of said formation fluid;
   (e) measuring the phase shift and attenuation of said electromagnetic wave at plural spaced locations within said internal flow passage and providing electronic output signals representing phase shift and attenuation of said electromagnetic wave at said spaced locations for characterization of said formation fluid as to dielectric constant and conductivity; and
   (f) comparing said electromagnetic signal and said output signals for detection of phases shift; and
   (g) relating said dielectric constant and conductivity of said formations fluid to hydrocarbon volume and fluid conductivity.

2. The method of claim 1, wherein said generating said electromagnetic wave comprises:
   generating an oscillating electrical radio frequency input signal at said predetermined point within said internal flow passage.

3. The method claim 1, wherein said relating said dielectric constant and conductivity of said formation fluid to hydrocarbon volume and fluid conductivity comprises:
   (a) electronically comparing detected electromagnetic wave phase shift and attenuation signals at each of said spaced locations with known parameters of phase shift and attenuation; and
   (b) providing a processed electronic signal output representing said electromagnetic wave phase shift and attenuation signals as a function of hydrocarbon volume of said formation fluid.

4. The method of claim 1, wherein said internal flow passage is defined by a coaxial transmission line having a signal input port a near receiver port, a far receiver port and a reflection termination port located in spaced relation along the length thereof, said method further comprising:
   (a) introducing a radio frequency electronic input signal at said input port for generation of said electromagnetic wave in said formation fluid;
   (b) detecting phase shift and attenuation of said electromagnetic wave at said near receiver port;
   (c) detecting phase shift and attenuation of said electromagnetic wave at said far receiver port;
   (d) placing an electronic load at said reflection termination port;
   (e) electronically comparing said electromagnetic wave phase shift and attenuation signals detected at said near and far receiver ports with said radio frequency electronic input signal and providing amplitude and phase detector output signals; and (f) relating said amplitude and phase detector output signals to known dielectric constant conductivity of formation fluid constiuents for determination of hydrocarbon volume and fluid conductivity.

5. A method for characterization for fluid conductivity and hydrocarbon volume formation fluid being transferred from a subsurface earth formation into a formation multi-tester instrument located in a borehole intersecting the formation, said method comprising:
 (a) providing a coaxial transmission line within said formation multi-tester instrument as a flow tube for said formation fluid;
 (b) generating an electromagnetic wave within said formation fluid within said flow tube in a transverse electromagnetic mode;
 (c) measuring the phase shift and attenuation of said electromagnetic wave within said flow tube for characterization of said formation fluid as to dielectric constant and conductivity; and
 (d) relating said dielectric constant and conductivity of said formation fluid to fluid conductivity and hydrocarbon volume.

6. The method of claim 5, wherein said generating said electromagnetic wave comprises:
 generating an oscillating electrical radio frequency input signal within said internal flow passage.

7. The method of claim 6, wherein said measuring of said phase shift and attenuation of said electromagnetic wave comprises:
 (a) detecting said input signal at spaced locations along the length of said internal flow passage;
 (b) providing a detected signal output at each of said spaced locations; and
 (c) detecting the ratio of phase shift and attenuation of said detected signal outputs in comparison with said input signal.

8. The method of claim 7, wherein said relating said dielectric constant and conductivity of said formation fluid to hydrocarbon volume and fluid conducitivity comprises:
 (a) comparing detected electromagnetic wave phase shift and attenuation signals at each of said spaced locations with known parameters of phase shift and attenuation; and
 (b) providing a signal output presenting said phase shift and attenuation signals as a function of hydrocarbon volume of said formation fluid.

9. The method of claim 5, wherein said internal flow passage is defined by a coaxial transmission line having a signal input port a near receiver port, a far receiver port and a reflection termination port located in spaced relation along the length thereof, said method further comprising:
 (a) introducing a radio frequency electronic input signal into said formation fluid at said input port;
 (b) detecting phase shift and attenuation of said electromagnetic wave input signal at said near receiver port and providing a first phase shift and attenuation signal;
 (c) detecting phase shift and attenuation of said electromagnetic wave input signal at said far receiver port and providing a second phase shift and attenuation signal;
 (d) placing a load at said reflection termination port in the form of an electric resistance;
 (e) comparing said phase shift and attenuation signals detected at said near and far receiver ports with said electromagnetic wave input signal and providing amplitude and phase detector output signals at each of said near and far receiver ports; and
 (f) relating said amplitude and phase detector output signals to known dielectric constant conductivity of formation fluid constituents for determination of hydrocarbon volume and fluid conductivity.

10. Apparatus for downhole measurement of fluid conductivity and hydrocarbon volume during formation testing, comprising:
 (a) a flow tube being disposed within a formation multi-tester instrument and adapted to receive a quantity of formation fluid therein;
 (b) a signal input port being provided at a predetermined point on said flow tube and receiving a radio frequency signal transmitter for generation of an electromagnetic wave within said formation fluid of said flow tube;
 (c) a near receiver sensor being provided in said flow tube in predetermined spaced relation with said signal input port for enabling detection of attenuation and phase shift of said electromagnetic wave by said formation fluid and providing output signals representing attenuation and phase shift of said electromagnetic wave at said near receiver sensor;
 (d) a far receiver sensor being provided in said flow tube in predetermined spaced relation with said near receiver sensor for enabling detection of further attenuation and phase shift of said electromagnetic wave by said formation fluid and providing output signals representing attenuation and phase shift of said electromagnetic wave at said far receiver sensor;
 (e) means for generating a radio frequency signal at said signal input port; and
 (f) means for receiving and processing the signal outputs of said near receiver sensor and said far receiver sensor for identification of the attenuation and phase shift that is induced to said electromagnetic wave by said formation fluid and thus characterizing said formation fluid for dielectric constant and conductivity, said signal receiving and processing means further establishing a relationship relating said dielectric constant and conductivity to hydrocarbon volume and fluid conductivity of said formation fluid.

11. The apparatus of claim 10, wherein said means for generating a radio frequency signal at said signal input port comprises:
 an electronic radio frequency oscillator circuit being coupled in driving relation with said radio frequency signal at said signal input port and operatively exciting said radio frequency signal transmitter at a predetermined frequency and amplitude for generation of said electromagnetic wave in said formation fluid within said flow tube.

12. The apparatus of claim 11, wherein said electronic frequency oscillator circuit includes:
 (a) an oscillator for generation of a radio frequency signal of predetermined frequency; and
 (b) a gain control amplifier and a power amplifier being coupled in series with said oscillator and being coupled in driving relation with said signal transmitter.

13. The apparatus of claim 10, wherein said means for receiving and processing said output signals of said near and far receivers comprises:
 (a) a local oscillator circuit providing a pair of amplified outputs;

(b) a pair of mixer circuits each being coupled in receiving relation with the outputs of respective ones of said near and far receivers;

(c) a phase detector circuit being coupled in receiving relation with each of said mixer circuits and providing an output representing the phase shift that occurs in said electromagnetic wave in said formation fluid over the distance between said near and far receivers; and (d) an amplitude detector circuit being coupled n receiving relation within each of said mixer circuits and providing outputs representing the signal amplitudes detected by each of said near and far receivers, said signal amplitude outputs representing attenuation induced to said electromagnetic wave by said formation fluid.

* * * * *